United States Patent
Morioka et al.

(10) Patent No.: US 12,490,383 B2
(45) Date of Patent: Dec. 2, 2025

(54) CIRCUIT ASSEMBLY (71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Hideo Morioka, Yokkaichi (JP); Arinobu Nakamura, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 469 days.

(21) Appl. No.: 18/043,672

(22) PCT Filed: Aug. 3, 2021

(86) PCT No.: PCT/JP2021/028691
§ 371 (c)(1),
(2) Date: Mar. 1, 2023

(87) PCT Pub. No.: WO2022/049963
PCT Pub. Date: Mar. 10, 2022

(65) Prior Publication Data
US 2023/0354526 A1    Nov. 2, 2023

(30) Foreign Application Priority Data
Sep. 3, 2020   (JP) .................................. 2020-148266

(51) Int. Cl.
*H05K 1/18*     (2006.01)
*H01L 25/11*    (2006.01)

(52) U.S. Cl.
CPC ............ *H05K 1/189* (2013.01); *H01L 25/115* (2013.01); *H05K 2201/0999* (2013.01); *H05K 2201/10166* (2013.01); *H05K 2201/10522* (2013.01)

(58) Field of Classification Search
CPC .......... H05K 1/189; H05K 2201/0999; H05K 2201/10166; H05K 2201/10522; H01L 25/115
(Continued)

(56) References Cited

U.S. PATENT DOCUMENTS 8,228,113 B2 *  7/2012  Domes ................ H03K 17/567
                                                327/437
2019/0164878 A1  5/2019  Hattori et al.
(Continued)

FOREIGN PATENT DOCUMENTS

JP    2010-022117 A    1/2010

OTHER PUBLICATIONS

International Search Report, Application No. PCT/JP2021/028691, mailed Oct. 26, 2021. ISA/Japan Patent Office.

*Primary Examiner* — Binh B Tran
(74) *Attorney, Agent, or Firm* — Honigman LLP (57) ABSTRACT An object of the present disclosure is to provide a technique with which it is possible to achieve a weight reduction in a circuit assembly that includes two semiconductor elements that constitute a bidirectional relay A circuit assembly includes: a first bus bar; a second bus bar; a first semiconductor element; a second semiconductor element; a power circuit portion that electrically connects a first power terminal of the first semiconductor element and a third power terminal of the second semiconductor element; and a control circuit portion for electrically connecting both a first signal terminal of the first semiconductor element and a second
(Continued)

signal terminal of the second semiconductor element to a control apparatus. At least one of the power circuit portion and the control circuit portion includes a flexible conductive path.

12 Claims, 6 Drawing Sheets

(58) Field of Classification Search
USPC .......................................................... 361/749
See application file for complete search history.

(56) References Cited

U.S. PATENT DOCUMENTS

2020/0185302 A1* 6/2020 Lu ..................... H01L 23/49811
2020/0404790 A1* 12/2020 Haraguchi ........... H05K 1/0313
2022/0022337 A1   1/2022 Hiratani et al.

* cited by examiner

CIRCUIT ASSEMBLY

CROSS-REFERENCE TO RELATED APPLICATIONS

This application is the U.S. national stage of PCT/JP2021/028691 filed on Aug. 3, 2021, which claims priority of Japanese Patent Application No. JP 2020-148266 filed on Sep. 3, 2020, the contents of which are incorporated herein.

TECHNICAL FIELD

The present disclosure relates to a circuit assembly.

BACKGROUND

JP 2019-96769A discloses a circuit assembly in which a semiconductor switching element and bus bars are connected. In the circuit assembly disclosed in JP 2019-96769A, a drain terminal and a source terminal of the semiconductor switching element are connected to a first bus bar and a second bus bar, respectively, and the semiconductor switching element is mounted on one of the bus bars.

JP 2020-13896A discloses a circuit board in which a semiconductor element and a conductive piece are connected to each other. In the circuit assembly disclosed in JP 2020-13896A, a terminal of the semiconductor element is connected to the conductive piece via an FPC (Flexible Printed Circuit). JP 2020-13896A also discloses that, with this configuration, it is possible to increase the degree of freedom in the position of the semiconductor element and reduce stress that is applied to a fixing portion of the semiconductor element.

The semiconductor elements of the circuit assemblies disclosed in: JP 2019-96769A and JP 2020-13896A are configured to control a flow of electric current in one direction. There is a need for a circuit assembly that includes two semiconductor elements that constitute a bidirectional relay, and a reduction in the weight of the circuit assembly.

To address this, it is an object of the present disclosure to provide a technique, with which it is possible to reduce the weight of a circuit assembly that includes two semiconductor elements that constitute a bidirectional relay.

SUMMARY

A circuit assembly according to the present disclosure is a circuit assembly including: a first bus bar and a second bus bar that constitute a power circuit; a first semiconductor element that includes a first power terminal, a second power terminal, and a first signal terminal; a second semiconductor element that includes a third power terminal, a fourth power terminal, and a second signal terminal; a power circuit portion that electrically connects the first power terminal and the third power terminal to each other; and a control circuit portion for electrically connecting both the first signal terminal and the second signal terminal to a control apparatus, wherein the second power terminal is electrically connected to the first bus bar, and the first semiconductor element is mounted on the first bus bar, the fourth power terminal is electrically connected to the second bus bar, and the second semiconductor element is mounted on the second bus bar, and at least either the power circuit portion or the control circuit portion includes a flexible conductive path.

Advantageous Effects of the Present Disclosure

According to the present disclosure, it is possible to reduce the weight of a circuit assembly that includes two semiconductor elements that constitute a bidirectional relay.

DETAILED DESCRIPTION OF PREFERRED EMBODIMENTS

First, aspects of an embodiment according to the present disclosure will be listed and described.

A circuit assembly according to the present disclosure is as follows.

First Aspect

A circuit assembly according to a first aspect includes: a first bus bar and a second bus bar that constitute a power circuit; a first semiconductor element that includes a first power terminal, a second power terminal, and a first signal terminal; a second semiconductor element that includes a third power terminal, a fourth power terminal, and a second signal terminal; a power circuit portion that electrically connects the first power terminal and the third power terminal to each other; and a control circuit portion for electrically connecting both the first signal terminal and the second signal terminal to a control apparatus, wherein the second power terminal is electrically connected to the first bus bar, and the first semiconductor element is mounted on the first bus bar, the fourth power terminal is electrically connected to the second bus bar, and the second semiconductor element is mounted on the second bus bar, and at least either the power circuit portion or the control circuit portion includes a flexible conductive path. At least one of the power circuit portion that electrically connects the first power terminal and the third power terminal to each other and the control circuit portion for electrically connecting the first signal terminal and the second signal terminal to the control apparatus includes a flexible conductive path. In the case where the power circuit portion includes a flexible conductive path, there is no need to use a bus bar as a member that electrically connects the first power terminal and the third power terminal, and thus the weight of the circuit assembly can be reduced. Also, in the case where the control circuit portion includes a flexible conductive path, the first signal terminal and the second signal terminal are both connected to the single flexible conductive path, and thus the weight of the circuit assembly can be reduced as compared with a circuit assembly in which the first signal terminal and the second signal terminal are connected to different flexible conductive paths.

Second Aspect

In a second aspect, the circuit assembly according to the first aspect, each of the power circuit portion and the control circuit portion may include a flexible conductive path. With this configuration, it is possible to enhance the effect of reducing the weight of the circuit assembly.

Third Aspect

In a third aspect, the circuit assembly according to the second aspect, both the conductive path of the power circuit portion and the conductive path of the control circuit portion may be provided in a single flexible wiring member. With this configuration, there is no need to provide a plurality of flexible wiring members, and thus the cost can be reduced.

Fourth Aspect

In a fourth aspect, the circuit assembly according to the third aspect, the conductive path of the control circuit portion may be provided along an outer edge of the flexible wiring member, and the conductive path of the power circuit portion may be provided in a region of the flexible wiring member that is surrounded by the conductive path of the control circuit portion. With this configuration, it is possible to provide the conductive path of the power circuit portion and the conductive path of the control circuit portion in a flexible wiring member that is composed of a single layer. With this configuration, there is no need to provide a plurality of circuit layers in the flexible wiring member, and thus the cost can be reduced.

Fifth Aspect

In a fifth aspect, the circuit assembly according to the third or the fourth aspects, the circuit assembly may further include: an insulation spacer that is provided between the first bus bar and the second bus bar. The flexible wiring member may be provided to extend from the first bus bar to the second bus bar across the insulation spacer. A connecting portion that connects the first power terminal and the power circuit portion and a connecting portion that connects the first signal terminal and the control circuit portion may be provided on the first bus bar. A connecting portion that connects the third power terminal and the power circuit portion and a connecting portion that connects the second signal terminal and the control circuit portion may be provided on the second bus bar. With this configuration, when the bus bars and the insulation spacer that have different thermal expansion coefficients thermally expand and contract, the flexible wiring member deforms, and thus a displacement between the connecting portions can be absorbed. As a result, a disconnection in the electrical connection of the connecting portions can be suppressed.

Sixth Aspect

In a sixth aspect, the circuit assembly according to any one of the first to the fifth aspects, a plurality of sets of the first semiconductor element and the second semiconductor element may be provided, and the first power terminals and the third power terminals of the plurality of sets of the first semiconductor element and the second semiconductor element may be connected to each other via one of the conductive paths. With this configuration, it is possible to reduce the electric resistance of the conductive path that connects the first power terminal and the third power terminal, and suppress the amount of heat generated when a large current flows.

A specific example of a circuit assembly according to an embodiment of the present disclosure will be described below with reference to the drawings. It is to be noted that the present disclosure is not limited to the examples given below, and the scope of the present disclosure is indicated by the appended claims, and all changes that come within the meaning and range of equivalency of the claims are intended to be embraced within the scope of the present disclosure.

Embodiment 1

Figure 1:
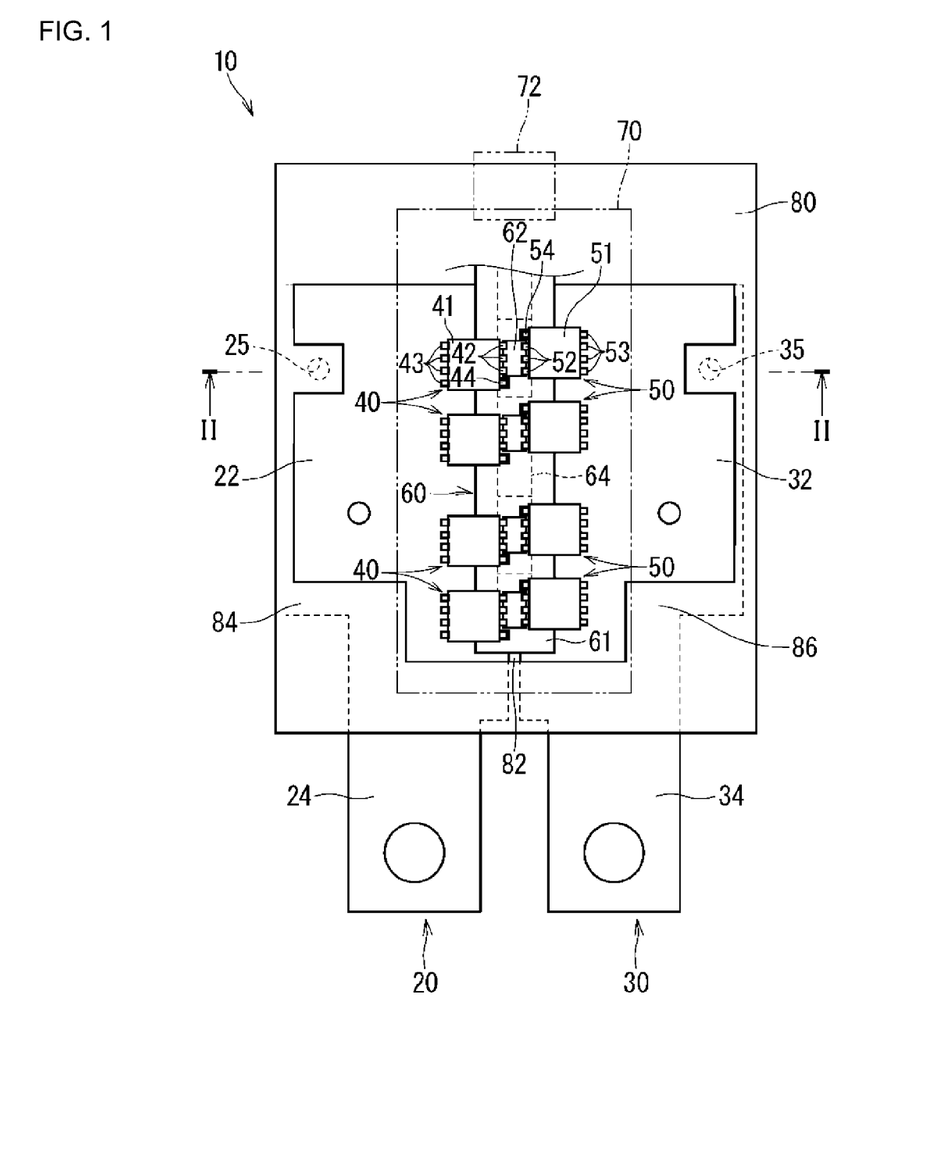
FIG. 1 is a schematic plan view of a circuit assembly according to Embodiment 1.
Figure 2:
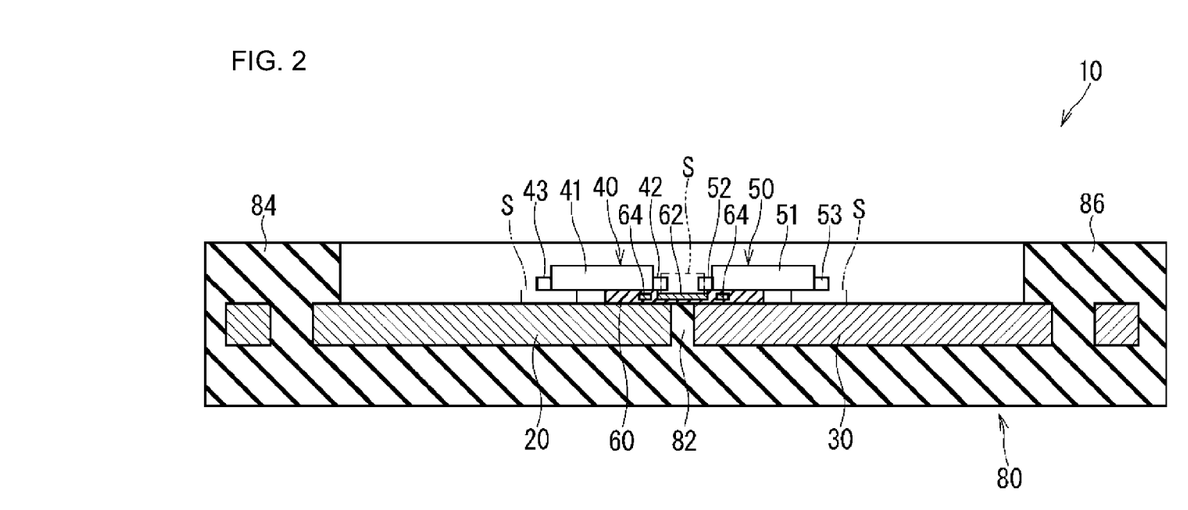
FIG. 2 is a schematic cross-sectional view taken along the line II-II shown in FIG. 1.
Figure 3:
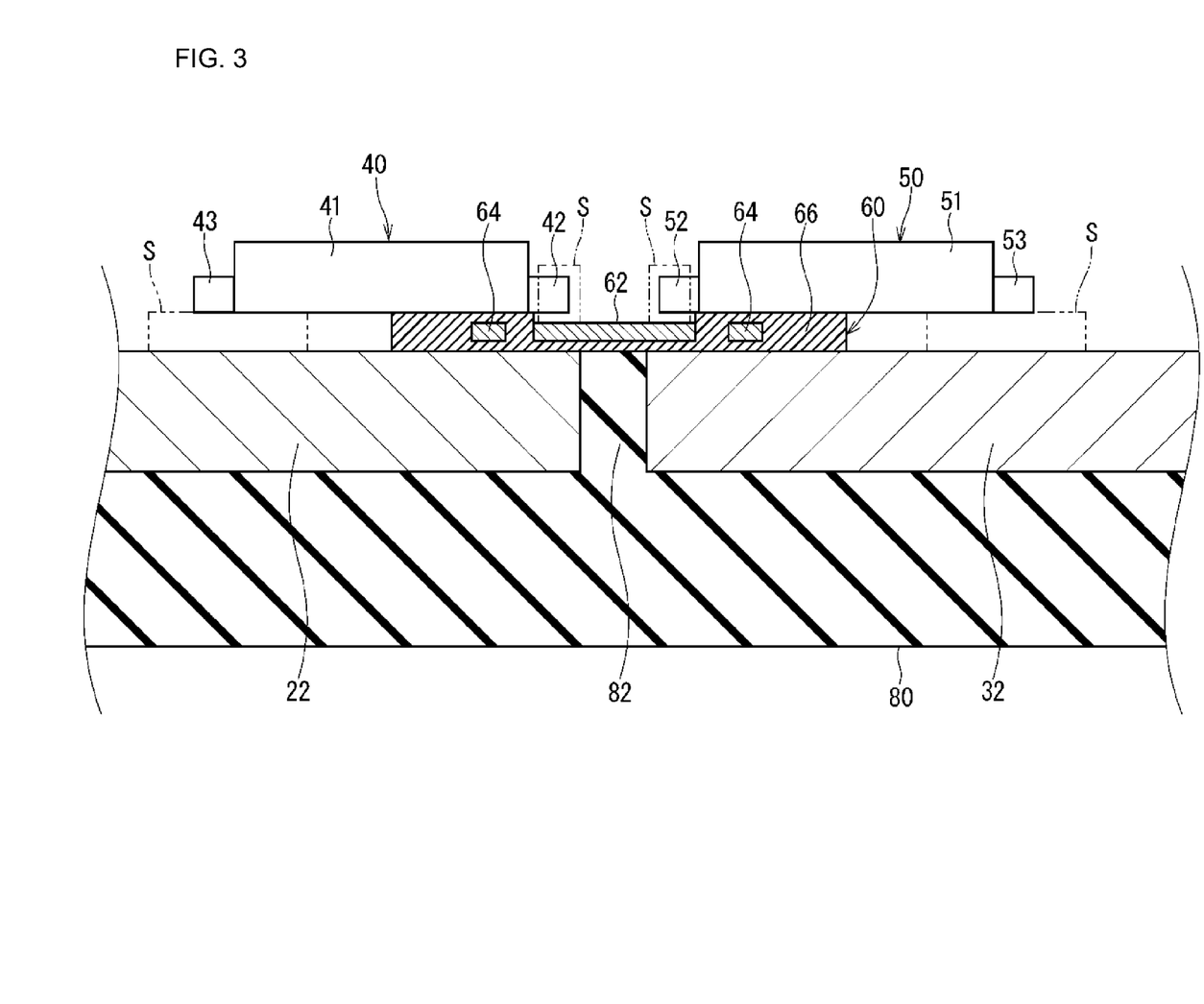
FIG. 3 is a partially enlarged view of FIG. 2.
Figure 4:
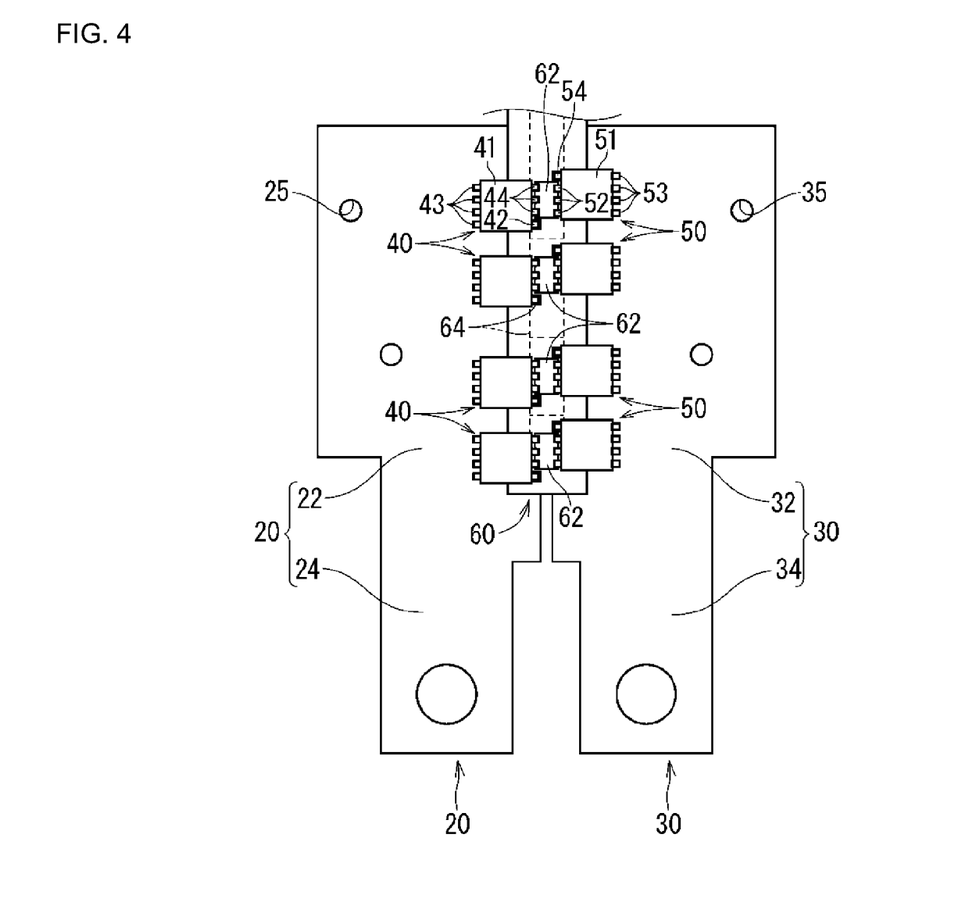
FIG. 4 is a schematic plan view of the circuit assembly from which a case is omitted.

Hereinafter, a circuit assembly 10 according to Embodiment 1 will be described. FIG. 1 is a schematic plan view of the circuit assembly 10 according to Embodiment 1. FIG. 2 is a schematic cross-sectional view taken along the line II-II shown in FIG. 1. FIG. 3 is a partially enlarged view of FIG. 2. FIG. 4 is a schematic plan view of the circuit assembly 10 from which a case 80 is omitted.

The circuit assembly 10 is mounted on, for example, a vehicle that includes a main system and a sub-system that are involved in an autonomous driving function. The circuit assembly 10 functions as a switching apparatus that electrically disconnects the main system and the sub-system when, for example, a failure occurs in the main system, and a switch is made to the sub-system. The circuit assembly 10 includes a first bus bar 20, a second bus bar 30, at least one first semiconductor element 40, at least one second semiconductor element 50, at least one power circuit portion, and at least one control circuit portion. In this example, the circuit assembly 10 is housed in a case 80.

The first bus bar 20 and the second bus bar 30 constitute a power circuit. The first bus bar 20 and the second bus bar 30 each have a plate-like shape and are made of a conductive material such as copper or a copper alloy. The first bus bar 20 includes a first element connecting portion 22 and a first external connecting portion 24. The second bus bar 30 includes a second element connecting portion 32 and a second external connecting portion 34. The first element connecting portion 22 is a portion that is connected to the first semiconductor element 40. The second element connecting portion 32 is a portion that is connected to the second semiconductor element 50. The first external connecting portion 24 and the second external connecting portion 34 are portions that are connected to an end portion of a wire harness, or the like. In this example, the first element connecting portion 22 and the second element connecting portion 32 each have a flat plate-like shape, and are housed in the case 80. The first element connecting portion 22 and the second element connecting portion 32 are provided side by side spaced apart such that their main surfaces are level with each other. An insulation spacer 82, which will be described later, is provided between the first element connecting portion 22 and the second element connecting portion 32. The first external connecting portion 24 and the second external connecting portion 34 each have a flat plate-like shape, and protrude outward from a case main body of the case 80 that surrounds the first element connecting portion 22 and the second element connecting portion 32. For example, a through hole is formed in each of the first external connecting portion 24 and the second external connecting portion 34. The first external connecting portion 24 and the second external connecting portion 34 are connected to wire harness terminals using bolts inserted into the through holes.

The first semiconductor element 40 and the second semiconductor element 50 are semiconductor switching elements that perform control to switch an electric current on and off. A semiconductor switching element includes two power terminals and a gate terminal. The semiconductor switching element performs control to switch the gate on and off via the gate terminal to perform control to switch an electric current flowing between the two power terminals on and off. However, there is a semiconductor switching element that can interrupt a flow of electric current from one power terminal to the other power terminal, but cannot completely interrupt a flow of electric current from the other power terminal to the one power terminal when the gate is off. In the case where such a semiconductor switching element performs control to switch a large electric current on and off, a leakage current that flows from the other power terminal to the one power terminal when the gate is off may be too large to ignore. To address this, two semiconductor switching elements (in the present embodiment, the first semiconductor element 40 and the second semiconductor element 50) are connected in series such that the two power terminals of each semiconductor switching element are provided in opposite directions to each other. With this configuration, one of the semiconductor switching elements interrupts a flow of electric current in one direction, and the other semiconductor switching element interrupts a flow of electric current in the other direction, and it is therefore possible to interrupt electric currents flowing in two directions in the circuit assembly. As the semiconductor switching elements described above, for example, MOSFETs (Metal-Oxide-Semiconductor Field-Effect Transistors) or the like may be used.

The first semiconductor element 40 includes a first power terminal 42, a second power terminal 43, and a first signal terminal 44. The first semiconductor element 40 is mounted on the first bus bar 20. The second semiconductor elements 50 includes a third power terminal 52, a fourth power terminal 53, and a second signal terminal 54. The second semiconductor element 50 is mounted on the second bus bar 30. The first power terminal 42 and the third power terminal 52 are electrically connected to each other via a power circuit portion. The second power terminal 43 is electrically connected to the first bus bar 20, and the fourth power terminal 53 is electrically connected to the second bus bar 30. The first signal terminal 44 and the second signal terminal 54 are connected to a control apparatus via a control circuit portion. For example, in the case where the first semiconductor element 40 and the second semiconductor element 50 are formed using MOSFETs, the first power terminal 42 and the third power terminal 52 serve as source terminals, the second power terminal 43 and the fourth power terminal 53 serve as drain terminals, and the first signal terminal 44 and the second signal terminal 54 serve as gate terminals. In the following description, the first power terminal 42 and the third power terminal 52 may be referred to as "the source terminals 42 and 52". Also, the second power terminal 43 and the fourth power terminal 53 may be referred to as "the drain terminals 43 and 53", and the first signal terminal 44 and the second signal terminal 54 may be referred to as "the gate terminals 44 and 54".

In the example shown in FIG. 1, the terminal arrangement of the first semiconductor element 40 and the terminal arrangement of the second semiconductor element 50 are the same. In the first semiconductor element 40, the source terminal 42 and the gate terminal 44 are provided on one side of a main body 41, and the drain terminal 43 is provided on the other side of the main body 41. Similarly, in the second semiconductor element 50 as well, the source terminal 52 and the gate terminal 54 are provided on one side of a main body 51, and the drain terminal 53 is provided on the other side of the main body 51. The first semiconductor element 40 and the second semiconductor element 50 are provided in opposite directions to each other such that the one side of the main body 41 where the source terminal 42 is provided and the one side of the main body 51 where the source terminal 52 is provided face each other. The first semiconductor element 40 and the second semiconductor element 50 are provided offset from each other in a direction in which the source terminals 42 and 52 and the gate terminals 44 and 54 are provided, such that the source terminals 42 and 52 face each other. The gate terminal 44 of the first semiconductor element 40 and the gate terminal 54 of the second semiconductor element 50 are offset from each other. The gate terminal 44 of the first semiconductor element 40 does not face the second semiconductor element 50. The gate terminal 54 of the second semiconductor element 50 does not face the first semiconductor element 40.

The power circuit portion is a circuit portion that connects the first power terminal 42 and the third power terminal 52 to each other. The power circuit portion includes a connecting portion for connection to the first power terminals 42 and a connecting portion for connection to the third power terminal 52. The control circuit portion is a circuit portion for receiving a control signal from a control apparatus or performing communication with a control apparatus to emit ON and OFF signals to both the first signal terminal 44 and the second signal terminal 54, and may have a current/voltage detection function, a safety function for MOSFET failures, and the like. The control circuit portion includes a connecting portion for connection to the first signal terminal 44 and a connecting portion for connection to the second signal terminal 54. The control apparatus may be, for example, an ECU (Electronic Control Unit) provided outside of the circuit assembly 10. The ECU and the circuit assembly 10 may be connected via a wire harness. For this reason, the control circuit portion includes a harness connecting portion.

At least one of the power circuit portion and the control circuit portion includes a flexible conductive path 62 or 64. In this example, the power circuit portion and the control circuit portion include flexible conductive paths 62 and 64, respectively. Here, the flexible conductive path 62 of the power circuit portion and the flexible conductive paths 64 of the control circuit portion are provided in a single flexible wiring member 60. Hereinafter, the flexible wiring member 60 will be described with reference to FIG. 5 in addition to FIGS. 1 to 4.

Figure 5:
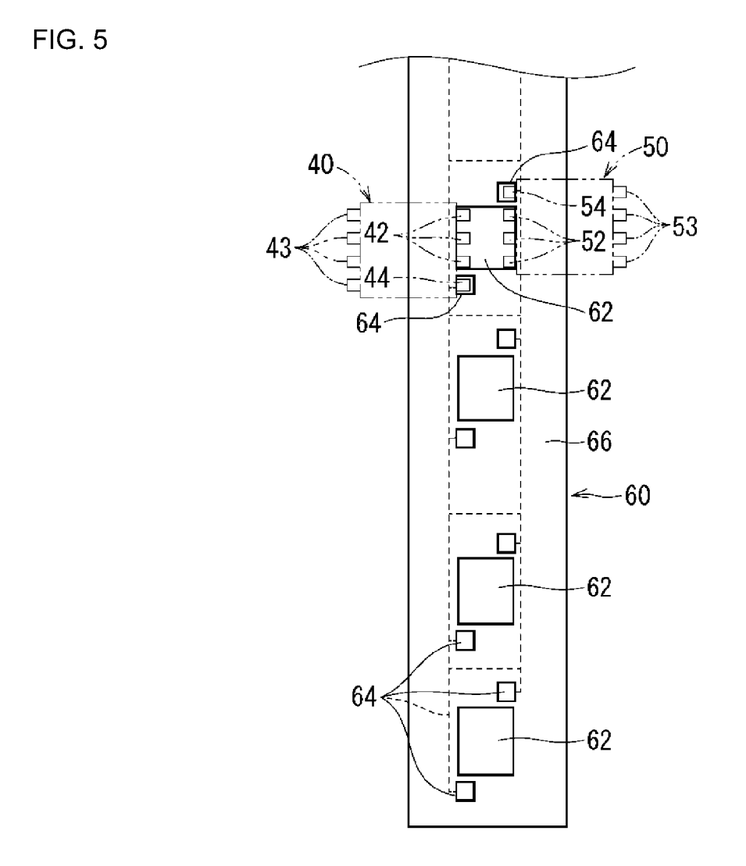
FIG. 5 is a plan view of a flexible wiring member.

FIG. 5 is a plan view of the flexible wiring member 60.

The flexible wiring member 60 includes the flexible conductive paths 62 and 64 and an insulating portion 66. The conductive paths 62 and 64 are formed using a conductor foil, a thin conductor plate, or the like. The insulating portion 66 is formed using an insulating film or the like. The conductive paths 62 and 64 and the insulating portion 66 are configured to be easily bendable. For example, the flexible wiring member 60 is formed using an FPC (Flexible Printed Circuit). The insulating portion 66 of the FPC is a board main body that is formed using, for example, a polyimide film or the like. The conductive paths 62 and 64 made of a copper foil or the like are provided on the board main body. The flexible conductive paths 62 and 64 are, for example, conductive paths that are formed on a flexible board (flexible printed circuit board). In the FPC, the conductive paths 62 and 64 are exposed at connecting portions between the source terminal 42 and the gate terminal 44 of the first semiconductor element 40 and the source terminal 52 and the gate terminal 54 of the second semiconductor element 50. The conductive paths 62 and 64 may be covered by a cover film or the like as appropriate, except for the connecting portions between the terminals 42, 44, 52, and 54 of the semiconductor elements 40 and 50. The flexible wiring member 60 does not necessarily need to be an FPC, and may be, for example, an FFC (Flexible Flat Cable) or the like.

In this example, the power circuit portion includes the conductive path 62, and the control circuit portion includes the conductive paths 64. Here, a set of source terminals 42 and 52 are connected to the same conductive path 62. Accordingly, the power circuit portion is substantially composed only of the conductive path 62, excluding the connecting member. The control circuit portion further includes, in addition to the conductive paths 64, a control board circuit portion that is provided in a control circuit board 70. In the control circuit portion, a connecting portion that is connected to the first signal terminal 44 and a connecting portion that is connected to the second signal terminal 54 are respectively provided on the conductive paths 64, and a harness connecting portion is provided in the control board circuit portion. There is no particular limitation on the connection means that connects the terminals 42, 44, 52, and 54 of the semiconductor elements 40 and 50 and the connection portions of the conductive paths 62 and 64. For example, these constituent elements can be connected using solder S, terminals, or the like.

FIGS. 2 and 3 show a state in which these constituent elements are connected using solder S.

In this example, in the flexible wiring member 60, two types of conductive paths 62 and 64 are formed in a single conductor layer. A portion of each conductive path 64 is provided along the outer edge of the flexible wiring member 60. Each conductive path 62 is provided in a region of the flexible wiring member 60 that is surrounded by insulating portion 66. At this time, the conductive path 62 is sized to be able to be connected to a set of the first semiconductor element 40 and the second semiconductor element 50. That is, a single flexible wiring member includes a plurality of conductive paths 62, and a plurality of sets of the first semiconductor element 40 and the second semiconductor element 50 are connected to different conductive paths 62.

Figure 6:
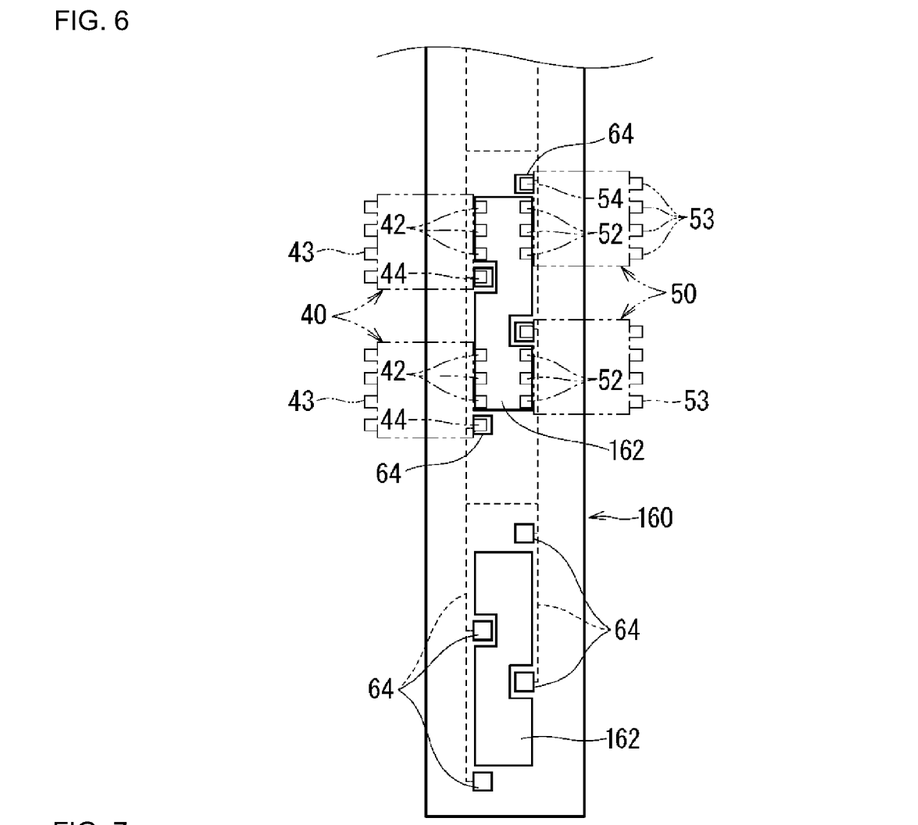
FIG. 6 is a plan view of a flexible wiring member according to a variation.

FIG. 6 is a plan view of a flexible wiring member that is a variation of the flexible wiring member 60.

A flexible wiring member 160 according to a variation is configured such that the source terminals 42 and 52 of a plurality of sets of a first semiconductor element 40 and a second semiconductor element 50 can be connected via a single flexible conductive path 162. In the example shown in FIG. 6, the conductive path 162 is formed to be longer than the conductive path 62 in a direction in which a plurality of first semiconductor elements 40 are arranged, the length corresponding to the plurality of (two in this example) first semiconductor elements 40. Two sets of a first semiconductor element 40 and a second semiconductor element 50 are connected to a single conductive path 162. In the example shown in FIG. 6, four sets of a first semiconductor element 40 and a second semiconductor element 50 are shown, with two sets of a first semiconductor element 40 and a second semiconductor element 50 and the other two sets of a first semiconductor element 40 and a second semiconductor element 50 being connected to different conductive paths 162. The four sets of a first semiconductor element 40 and a second semiconductor element 50 may be connected to a single flexible conductive path of a power circuit portion.

The insulation spacer 82 separates the first bus bar 20 and the second bus bar 30 from each other. For example, the insulation spacer 82 is a portion of the case 80. The flexible wiring member 60 is provided to extend from the first bus bar 20 to the second bus bar 30 across the insulation spacer 82. A connecting portion that connects the source terminal 42 and the conductive path 62 and a connecting portion that connects the gate terminal 44 and the conductive path 64 are provided on the first bus bar 20. A connecting portion that connects the source terminal 52 and the conductive path 62 and a connecting portion that connects the gate terminal 54 and the conductive path 64 are provided on the second bus bar 30.

The control circuit board 70 includes a board main body made of an insulating material and a control board circuit portion made of a conductive material. In this example, it is assumed that the control circuit board 70 is a printed board with a rigid board main body, but the control circuit board 70 may be a printed board with a flexible board main body, or the like. Connecting portions that are connected to the conductive paths 64 are provided in the control board circuit portion. The control unit 70 may be provided with a connector 72 serving as a harness connecting portion. The connector 72 includes a connector housing made of an insulating resin and a connector terminal that electrically connects the control circuit board and an external conductor. The control circuit board 70 may be fixed to, for example, the case 80, or the bus bars 20 and 30. For example, the control circuit board 70 may be supported by the case 80 while being spaced apart from the bus bars 20 and 30.

The case 80 is formed using a material such as an insulative resin. The case 80 is a molded article obtained through insert molding using the first bus bar 20 and the second bus bar 30 as insert parts. The case 80 includes the insulation spacer 82, a first bus bar holding portion 84, and a second bus bar holding portion 86. The insulation spacer 82 is a portion that is provided between the first bus bar 20 and the second bus bar 30 to separate the first bus bar 20 and the second bus bar 30 from each other. A lateral side of the insulation spacer 82 is in contact with the first bus bar 20, and another lateral side of the insulation spacer 82 is in contact with the second bus bar 30. The upper surface of the insulation spacer 82 may be flush with the main surface of the first bus bar 20 and the main surface of the second bus bar 30.

The first bus bar holding portion 84 is a portion that holds the first bus bar 20. An outer edge portion of the first bus bar 20, which is on the opposite side of another outer edge portion of the first bus bar 20 that is in contact with the insulation spacer 82, is held by the first bus bar holding portion 84. Also, in the first bus bar 20, a joining portion that joins the first element connecting portion 22 and the first external connecting portion 24 to each other is held by the first bus bar holding portion 84. The second bus bar holding portion 86 is a portion that holds the second bus bar 30. An outer edge portion of the second bus bar 30, which is on the opposite side of another outer edge portion of the second bus bar 30 that is in contact with the insulation spacer 82, is held by the second bus bar holding portion 86. Also, in the second bus bar 30, a joining portion that joins the second element connecting portion 32 and the second external connecting portion 34 to each other is held by the second bus bar holding portion 86. For example, the first bus bar holding portion 84 sandwiches the first bus bar 20 in the thickness direction of the first bus bar 20 to hold the first bus bar 20. Likewise, the second bus bar holding portion 86 sandwiches the second bus bar 30 in the thickness direction of the second bus bar 30 to hold the second bus bar 30. A through hole 25 is formed in a portion of the first bus bar 20 that is held by the first bus bar holding portion 84. In the first bus bar holding portion 84, a portion that covers one surface of the first bus bar 20 and a portion that covers the other surface of the first bus bar 20 are in communication with each other via a joining portion in the through hole 25. Likewise, a through hole 35 is formed in a portion of the second bus bar 30 that is held by the second bus bar holding portion 86. In the second bus bar holding portion 86 as well, a portion that covers one surface of the second bus bar 30 and a portion that covers the other surface of the second bus bar 30 are in communication with each other via a joining portion in the through hole 35.

The case 80 may include a fixing portion for fixing the control circuit board 70, a fixing portion for fixing the cover, and the like. The fixing portions may be, for example, screw holes. Alternatively, the fixing portions may be, for example, either engaging protrusion portions or engaging recess portions used in an engaging structure for engagement with a partner member.

Figure 7:
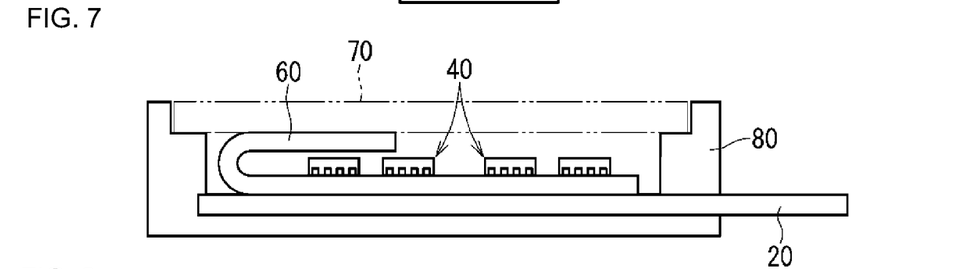
FIG. 7 is a schematic diagram showing a connection configuration for connecting a flexible wiring member and a control circuit board to each other.
Figure 8:
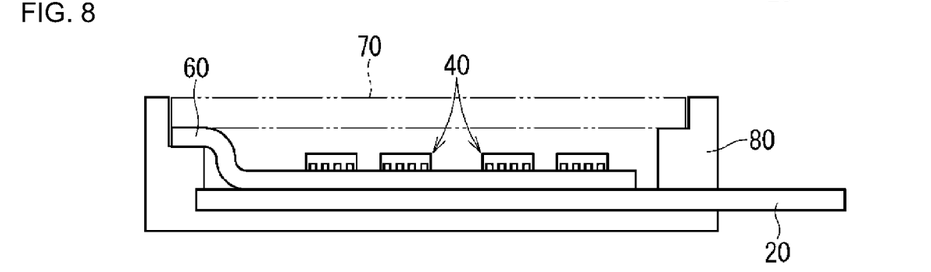
FIG. 8 is a schematic diagram showing another connection configuration for connecting the flexible wiring member and the control circuit board to each other.

The conductive paths 64 of the flexible wiring member 60 are connected to the control board circuit portion of the control circuit board 70 on the other end side thereof. FIG. 7 is a schematic diagram showing a connection configuration for connecting the flexible wiring member 60 and the control circuit board 70 to each other. FIG. 8 is a schematic diagram showing another connection configuration for connecting the flexible wiring member 60 and the control circuit board 70 to each other. For example, the flexible wiring member 60 may be bent in the thickness direction thereof at a portion between the control circuit board 70 and the bus bar 20 or 30, with one end portion of the flexible wiring member 60 being in contact with the bus bar 20 or 30 and the other end portion of the flexible wiring member 60 being in contact with the control circuit board 70. As shown in the example shown in FIG. 7, the flexible wiring member 60 may be folded back in the thickness direction at a portion between one end portion and the other end portion of the flexible wiring member 60. As shown in the example shown in FIG. 8, the flexible wiring member 60 may be curved, instead of being folded back in the thickness direction, at a portion between one end portion and the other end portion of the flexible wiring member 60. The flexible wiring member 60 does not necessarily need to be folded back or curved at a portion between one end portion and the other end portion of the flexible wiring member 60. The conductive paths 64 and the control board circuit portion can be connected using, for example, solder, a terminal, a connector, or the like.

As another connection configuration for connecting the flexible wiring member 60 and the control circuit board 70, the flexible wiring member 60 and the control circuit board 70 may be connected without being in contact with each other. In this case, for example, a terminal provided in at least one of the flexible wiring member 60 and the control circuit board 70 may be extended to the other of the flexible wiring member 60 and the control circuit board 70 to connect the flexible wiring member 60 and the control circuit board 70 via the terminal.

Advantageous Effects and the Like of Embodiment 1

At least one of the power circuit portion for electrically connecting the source terminals 42 and 52 and the control circuit portion for electrically connecting the gate terminals 44 and 54 to the control apparatus includes the conductive path 62 or 64. In this example, both the power circuit portion and the control circuit portion include the conductive paths 62 and 64, respectively. In the case where the power circuit portion includes the conductive path 62, there is no need to use a bus bar as a member that electrically connects the source terminals 42 and 52, and thus the weight of the circuit assembly 10 can be reduced. Also, in the case where the control circuit portion includes the conductive path 64, the gate terminals 44 and 54 are connected to a single conductive path 64, and thus the weight of the circuit assembly 10 can be reduced as compared with a circuit assembly in which the gate terminals 44 and 54 are connected to different conductive paths.

Also, the conductive paths 62 of the power circuit portions and the conductive paths 64 of the control circuit portions are both provided in a single flexible wiring member 60. With this configuration, there is no need to provide a plurality of flexible wiring members 60, and thus the can be reduced.

Also, the conductive paths 64 of the control circuit portion are provided along the outer edge of the flexible wiring member 60, and the conductive path 62 of the power circuit portion is provided in a region of the flexible wiring member 60 that is surrounded by the conductive paths 64 of the control circuit portion. With this configuration, the power circuit portion and the control circuit portion can be provided in a single flexible wiring member 60. There is no need to provide a plurality of conductive path layers in the flexible wiring member 60, and thus the cost can be reduced.

Also, the flexible wiring member 60 is provided to extend from the first bus bar 20 to the second bus bar 30 across the insulation spacer 82. The connecting portion that connects the source terminal 42 and the power circuit portion and the connecting portion that connects the gate terminal 44 and the control circuit portions are provided on the first bus bar 20, and the connecting portion that connects the source terminal 52 and the power circuit portion and the connecting portion that connects the gate terminal 54 and the control circuit portion are provided on the second bus bar 30. With this configuration, when the bus bars 20 and 30 and the insulation spacer 82 that have different thermal expansion coefficients thermally expand and contract, the flexible wiring member 60 deforms, and thus displacement between the connecting portions can be absorbed. As a result, a disconnection in the electrical connection in the connecting portions can be suppressed.

Also, in the case where the flexible wiring member 160 is adopted, the source terminals 42, 52 of a plurality of sets of a first semiconductor element 40 and a second semiconductor element 50 are connected via a single conductive path 162. With this configuration, it is possible to reduce the electric resistance of the conductive path 162 that connects the source terminals 42 and 52 and suppress the amount of heat generated when a large current flows.

Variations

In the foregoing, a configuration was described in which both the power circuit portion and the control circuit portion include the conductive paths 62 and 64, respectively. However, this configuration is not essential. Only one of the power circuit portion and the control circuit portion may include a conductive path, for example, only the power circuit portion may include the conductive path 62, or only the control circuit portion may include the conductive path 64. In the case where only the power circuit portion includes the conductive path 62, for example, the gate terminals 44 and 54 may be directly connected to the control circuit board 70 via a terminal provided on the control circuit board 70 or the like, without using the conductive path 64. In the case where only the control circuit portion includes the conductive path 64, for example, the source terminals 42 and 52 may be connected via a third bus bar that is provided separate from the first bus bar 20 and the second bus bar 30.

Also, in the foregoing, a configuration was described in which the conductive path 62 of the power circuit portion and the conductive paths 64 of the control circuit portion are provided in the single flexible wiring member 60. However, this configuration is not essential. A flexible wiring member that includes a conductive path 62 of a power circuit portion and a flexible wiring member that includes a conductive path 64 of a control circuit portion may be provided separately.

Also, in the foregoing, a configuration was described in which the conductive path 62 of the power circuit portion and the conductive paths 64 of the control circuit portion are provided in the same layer of the single flexible wiring member 60. However, this configuration is not essential. A single flexible wiring member may be composed of a plurality of conductive layers, wherein a conductive path of a power circuit portion and a conductive path of a control circuit portion are formed in different conductive layers.

The configurations described in the embodiment and the variations given above can be combined as appropriate provided no contradiction arises therebetween.

The invention claimed is:

1. A circuit assembly comprising:
a first bus bar and a second bus bar that constitute a power circuit;
a first semiconductor element that includes a first power terminal, a second power terminal, and a first signal terminal;
a second semiconductor element that includes a third power terminal, a fourth power terminal, and a second signal terminal;
a power circuit portion that electrically connects the first power terminal and the third power terminal to each other; and
a control circuit portion for electrically connecting both the first signal terminal and the second signal terminal to a control apparatus,
wherein the second power terminal is electrically connected to the first bus bar, and the first semiconductor element is mounted on the first bus bar,
the fourth power terminal is electrically connected to the second bus bar, and the second semiconductor element is mounted on the second bus bar, and
at least one of the power circuit portion and the control circuit portion includes a flexible conductive path.

2. The circuit assembly according to claim 1, wherein each of the power circuit portion and the control circuit portion includes a flexible conductive path.

3. The circuit assembly according to claim 2, wherein both the conductive path of the power circuit portion and the conductive path of the control circuit portion are provided in a single flexible wiring member.

4. The circuit assembly according to claim 3, wherein the conductive path of the control circuit portion is provided along an outer edge of the flexible wiring member, and
the conductive path of the power circuit portion is provided in a region of the flexible wiring member that is surrounded by the conductive path of the control circuit portion.

5. The circuit assembly according to claim 3, further comprising:
an insulation spacer that is provided between the first bus bar and the second bus bar,
wherein the flexible wiring member is provided so as to extend from the first bus bar to the second bus bar across the insulation spacer,
a connecting portion that connects the first power terminal and the power circuit portion and a connecting portion that connects the first signal terminal and the control circuit portion are provided on the first bus bar, and
a connecting portion that connects the third power terminal and the power circuit portion and a connecting portion that connects the second signal terminal and the control circuit portion are provided on the second bus bar.

6. The circuit assembly according to claim 1, wherein a plurality of sets of the first semiconductor element and the second semiconductor element are provided, and
the first power terminals and the third power terminals of the plurality of sets of the first semiconductor element and the second semiconductor element are connected to each other via one of the conductive paths.

7. The circuit assembly according to claim 4, further comprising:
an insulation spacer that is provided between the first bus bar and the second bus bar,
wherein the flexible wiring member is provided so as to extend from the first bus bar to the second bus bar across the insulation spacer,
a connecting portion that connects the first power terminal and the power circuit portion and a connecting portion that connects the first signal terminal and the control circuit portion are provided on the first bus bar, and
a connecting portion that connects the third power terminal and the power circuit portion and a connecting portion that connects the second signal terminal and the control circuit portion are provided on the second bus bar.

8. The circuit assembly according to claim 4, further comprising:
an insulation spacer that is provided between the first bus bar and the second bus bar,
wherein the flexible wiring member is provided so as to extend from the first bus bar to the second bus bar across the insulation spacer,
a connecting portion that connects the first power terminal and the power circuit portion and a connecting portion that connects the first signal terminal and the control circuit portion are provided on the first bus bar, and
a connecting portion that connects the third power terminal and the power circuit portion and a connecting portion that connects the second signal terminal and the control circuit portion are provided on the second bus bar.

9. The circuit assembly according to claim 2, wherein a plurality of sets of the first semiconductor element and the second semiconductor element are provided, and
the first power terminals and the third power terminals of the plurality of sets of the first semiconductor element and the second semiconductor element are connected to each other via one of the conductive paths.

10. The circuit assembly according to claim 3, wherein a plurality of sets of the first semiconductor element and the second semiconductor element are provided, and
the first power terminals and the third power terminals of the plurality of sets of the first semiconductor element and the second semiconductor element are connected to each other via one of the conductive paths.

11. The circuit assembly according to claim 4, wherein a plurality of sets of the first semiconductor element and the second semiconductor element are provided, and
the first power terminals and the third power terminals of the plurality of sets of the first semiconductor element and the second semiconductor element are connected to each other via one of the conductive paths.

12. The circuit assembly according to claim 2, wherein a plurality of sets of the first semiconductor element and the second semiconductor element are provided, and
the first power terminals and the third power terminals of the plurality of sets of the first semiconductor element and the second semiconductor element are connected to each other via one of the conductive paths.

\* \* \* \* \*